(12) United States Patent
Ishibashi et al.

(10) Patent No.: US 8,497,192 B2
(45) Date of Patent: Jul. 30, 2013

(54) METHOD OF MANUFACTURING A SEMICONDUCTOR DEVICE AND SUBSTRATE PROCESSING APPARATUS

(75) Inventors: Kiyohisa Ishibashi, Toyama (JP); Atsushi Moriya, Toyama (JP); Takaaki Noda, Toyama (JP); Kiyohiko Maeda, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 77 days.

(21) Appl. No.: 13/178,232

(22) Filed: Jul. 7, 2011

(65) Prior Publication Data

US 2012/0009764 A1 Jan. 12, 2012

(30) Foreign Application Priority Data

Jul. 8, 2010 (JP) ................................. 2010-155937

(51) Int. Cl.
*H01L 21/20* (2006.01)
(52) U.S. Cl.
USPC .................... 438/481; 438/479; 257/E21.101
(58) Field of Classification Search
USPC ................................................. 438/481, 478
See application file for complete search history.

(56) References Cited

U.S. PATENT DOCUMENTS

| 6,066,520 | A | * | 5/2000 | Suzuki | 438/202 |
| 7,468,311 | B2 | * | 12/2008 | Dip et al. | 438/478 |
| 7,667,227 | B2 | * | 2/2010 | Shimamune et al. | 257/19 |

FOREIGN PATENT DOCUMENTS

| JP | 05-206040 A | 8/1993 |
| JP | 2008-034462 A | 2/2008 |
| JP | 4394120 B2 | 1/2010 |
| JP | 2010-073860 A | 4/2010 |

\* cited by examiner

*Primary Examiner* — Charles Garber
*Assistant Examiner* — Reema Patel
(74) *Attorney, Agent, or Firm* — Volpe and Koenig, P.C.

(57) ABSTRACT

A method of manufacturing a semiconductor device includes conveying a first substrate provided with an opposing surface having insulator regions and a semiconductor region exposed between the insulator regions and a second substrate provided with an insulator surface exposed toward the opposing surface of the first substrate, into a process chamber in a state that the second substrate is arranged in to face the opposing surface of the first substrate, and selectively forming a silicon-containing film with a flat surface at least on the semiconductor region of the opposing surface of the first substrate by heating an inside of the process chamber and supplying at least a silicon-containing gas and a chlorine-containing gas into the process chamber.

11 Claims, 11 Drawing Sheets

Before Cleaning

SC-1 & SC-2 Cleaning

METHOD OF MANUFACTURING A SEMICONDUCTOR DEVICE AND SUBSTRATE PROCESSING APPARATUS

CROSS-REFERENCE TO RELATED APPLICATIONS

This application is based upon and claims the benefit of priority from Japanese Patent Application No. 2010-155937, filed on Jul. 8, 2010, the entire contents of which are incorporated herein by reference.

TECHNICAL FIELD

The present disclosure relates to a method of manufacturing a semiconductor device and a substrate processing apparatus.

BACKGROUND

A substrate such as a silicon (Si) wafer may have a semiconductor region exposed between insulator regions, on which an epitaxial film of silicon (Si) or silicon germanium (SiGe) is formed by selective growth. In the case where the selective growth of an epitaxial film is implemented using a substrate processing apparatus, e.g., a hot-wall type CVD apparatus, a substrate such as a silicon (Si) wafer is first loaded into a reaction furnace and then the reaction furnace is heated or cooled to a target film-forming temperature. After the reaction furnace has reached the target film-forming temperature, it takes a certain amount of stabilization time sufficient to stabilize the internal temperature of the reaction furnace and the temperature of the inside of the wafer surface. Thereafter, a source gas is supplied to the reaction furnace and an epitaxial film of silicon (Si) or silicon germanium (SiGe) is formed by selective growth.

Conventionally, to reliably perform selective growth, the rear surface (opposing surface) of a substrate arranged immediately above a film-forming target substrate is made of a silicon (Si)-based material. Referring to Japanese Patent Laid-Open Publication No. Hei5-206040, for example, the rear surface of a substrate is made of a silicon (Si)-based material such as polysilicon (poly-Si). In this case, prior to performing selective growth of a silicon (Si) film or a silicon germanium (SiGe) film, the silicon (Si) on the rear surface of the substrate is exposed by wet-cleaning or dry-cleaning the substrate in the course of a substrate manufacturing step in which a natural oxide film is removed from the substrate. Thereafter, an epitaxial film is formed by selective growth.

Further, Japanese Patent No. 4394120 discloses a method without exposing silicon (Si) on the rear surface (opposing surface) of a substrate, where dummy substrates are charged into a boat at a pitch twice as great as a normal pitch and the boat is loaded into a reaction furnace to form polysilicon (poly-Si) films on the dummy substrates in advance. A product substrate is inserted between the dummy substrates having the polysilicon (poly-Si) films formed thereon. Then, the boat is loaded into the reaction furnace once again to perform selective growth of an epitaxial film.

In the aforementioned related art in which the opposing surface of a substrate is made of silicon (Si) or polysilicon (poly-Si), however, a silicon (Si)-containing film tends to obtain a stable shape when the silicon (Si)-containing film is formed on a semiconductor region of a substrate exposed between insulator regions. This may cause the migration of silicon (Si), and as a result, the shape of the silicon (Si)-containing film becomes uneven and sometimes becomes round. This problem is particularly conspicuous when performing selective growth of a thin silicon (Si) film or a thin silicon germanium (SiGe) film having a thickness of about 100 Å.

SUMMARY

The present disclosure provides some embodiments of a method of manufacturing a semiconductor device and a substrate processing apparatus, which are capable of selectively forming a silicon-containing film with a flat surface on a semiconductor region of a substrate.

According to one embodiment of the present disclosure, there is provided a method of manufacturing a semiconductor device, including: conveying a first substrate provided with an opposing surface having insulator regions and a semiconductor region exposed between the insulator regions and a second substrate provided with an insulator surface exposed toward the opposing surface of the first substrate, into a process chamber in a state that the second substrate is arranged to face the opposing surface of the first substrate; and a second step of selectively forming a silicon-containing film with a flat surface at least on the semiconductor region of the opposing surface of the first substrate by heating an inside of the process chamber and supplying at least a silicon-containing gas and a chlorine-containing gas into the process chamber.

According to another embodiment of the present disclosure, there is provided a method of manufacturing a semiconductor device, including: providing a plurality of substrates each provided with a front surface and a rear surface, the front surface having insulator regions and a semiconductor region arranged between the insulator regions, at least the semiconductor region of the front surface being covered with an oxide film, the rear surface being covered with an oxide film; removing the oxide film formed on the semiconductor region of the front surface while keeping intact the oxide film formed on the rear surface; conveying the substrates, in which the oxide film formed on the semiconductor region is removed with the oxide film formed on the rear surface remaining intact, into a process chamber in a state that the substrates are stacked one above another at a predetermined interval; and selectively forming a silicon-containing film on the semiconductor region of each of the substrates by heating the process chamber and supplying at least a silicon-containing gas and a chlorine-containing gas into the process chamber.

According to still another embodiment of the present disclosure, there is provided a substrate processing apparatus, including: a process chamber configured to accommodate and process a first substrate provided with an opposing surface having insulator regions and a semiconductor region exposed between the insulator regions and a second substrate provided with an insulator surface exposed toward the opposing surface of the first substrate; a first gas supply system configured to supply a silicon-containing gas into the process chamber; a second gas supply system configured to supply a chlorine-containing gas into the process chamber; a heater configured to heat the first substrate and the second substrate; and a controller configured to control the heater, the first gas supply system and the second gas supply system such that the silicon-containing gas and the chlorine-containing gas are supplied between the first substrate and the second substrate, the second substrate arranged to face the opposing surface of the first substrate, to selectively form a silicon-containing film with a flat surface at least on the semiconductor region of the first substrate.

DETAILED DESCRIPTION

Figure 1:
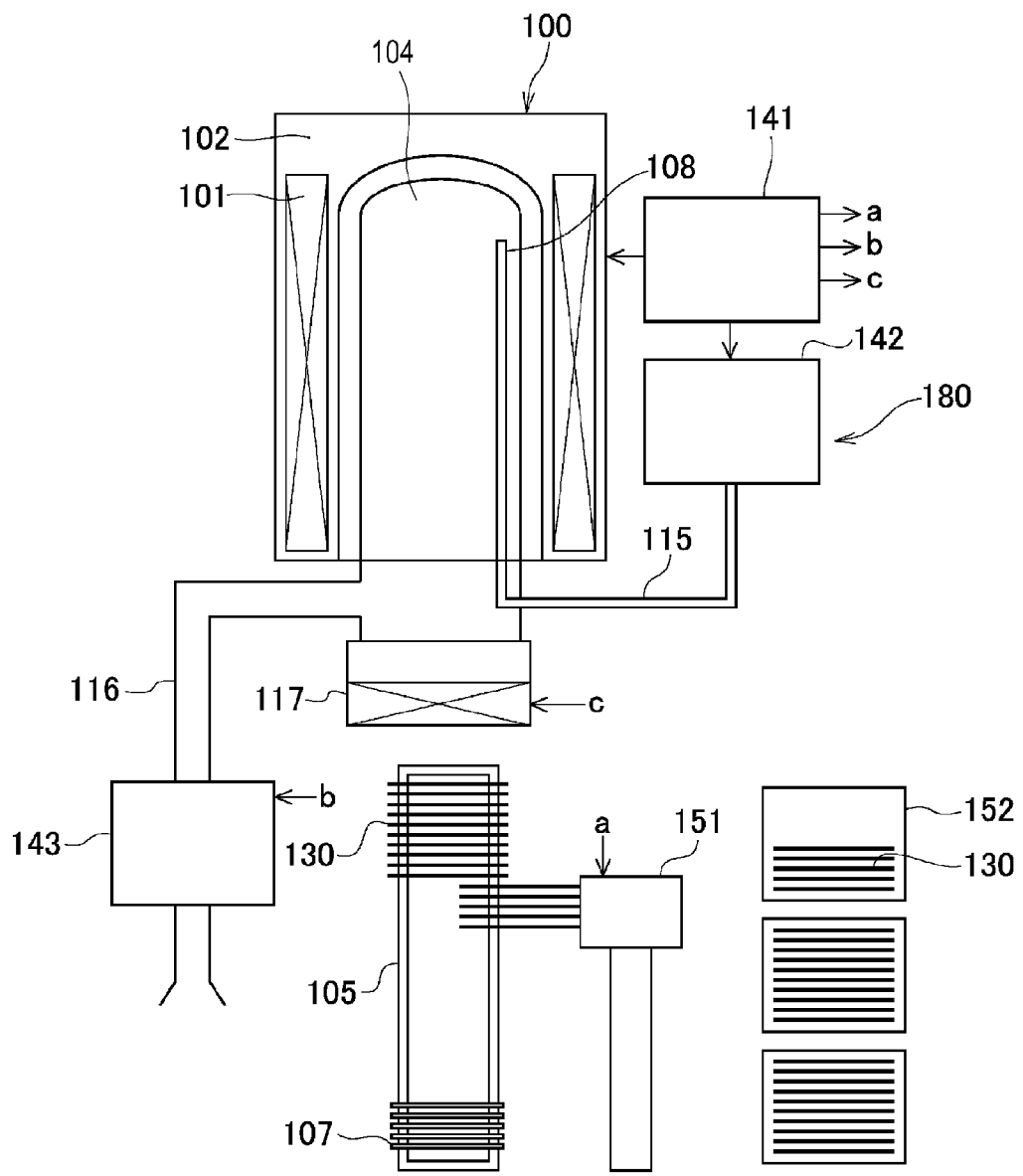
FIG. 1 is a schematic overall view showing a vertical low-pressure CVD apparatus according to a first embodiment of the present disclosure.

As mentioned above, the migration of silicon (Si) may easily occur and thus the shape of a silicon-containing film becomes uneven, according to the related art method in which a silicon-containing film is allowed to selectively grow on a semiconductor region of a substrate which is provided so that another substrate exposes a silicon-based film formed on a surface opposing thereto. According to one embodiment of the present disclosure, a surface of a second substrate opposing a first substrate is formed of an insulator surface. A silicon (Si)-containing gas and a chlorine (Cl)-containing gas are supplied into a reaction chamber. If the surface of the second substrate opposing to the first substrate is formed of the insulator surface, the migration of silicon (Si) is suppressed by the chlorine components contained in the chlorine (Cl)-containing gas. This makes it possible to selectively form, within the reaction chamber, a silicon-containing film with a flat surface on a semiconductor region of the first substrate in a reliable manner.

[Method of Manufacturing a Semiconductor Device]

Hereinafter, certain embodiments of a method of manufacturing a semiconductor device will be described in detail.

One Embodiment

A method of manufacturing a semiconductor device according to one embodiment of the present disclosure includes: providing a first substrate provided with an opposing surface having insulator regions and a semiconductor region exposed between the insulator regions and a second substrate provided with an insulator surface exposed toward the opposing surface of the first substrate; arranging the second substrate to face the opposing surface of the first substrate; and selectively forming a silicon-containing film with a flat surface at least on the semiconductor region of the first substrate by supplying a silicon-containing gas and a chlorine-containing gas to at least between the first substrate and the second substrate.

The insulator regions of the first substrate are exposed. The semiconductor region of the first substrate is exposed between the insulator regions. The second substrate is arranged to face the first substrate. The insulator surface of the second substrate is exposed toward the opposing surface of the first substrate. The first substrate and the second substrate are, e.g., silicon (Si) wafers. The insulator regions of the first substrate and the insulator surface of the second substrate are made of, e.g., a silicon oxide (SiO) material or a silicon nitride (SiN) material. The semiconductor region of the first substrate is made of, e.g., a silicon (Si) material.

The silicon-containing film is, e.g., an epitaxial film of silicon (Si) or silicon germanium (SiGe). The silicon-containing film may be formed at least on the first substrate. Alternatively, the silicon-containing film may be formed not only on the first substrate but also on the second substrate. In this case, similar to the first substrate, the silicon-containing film of the second substrate is selectively formed on a semiconductor region thereof. The first substrate and the second substrate may be different ones or may be identical with each other.

In case where the silicon-containing film to be formed is a silicon (Si) film, the silicon (Si)-containing gas may be, e.g., a silane ($SiH_4$) gas, a disilane ($Si_2H_6$) gas or a dichlorosilane ($SiH_2Cl_2$) gas. The chlorine (Cl)-containing gas may be, e.g., a chlorine ($Cl_2$) gas or a hydrogen chloride (HCl) gas which differs from the silicon (Si)-containing gas. In addition, a diluent gas (e.g., a $H_2$ gas) may be supplied between the first substrate and the second substrate. In case where the silicon-containing film to be formed is a silicon germanium (SiGe) film, the silicon (Si)-containing gas is added with germane ($GeH_4$).

According to the method of the present embodiment, if a silicon (Si)-containing gas and a chlorine (Cl)-containing gas are supplied between the first substrate and the second substrate, chlorine (Cl) components exhibiting increased surface coverage are chlorine (Cl)-terminated in a growth region, namely in the semiconductor region of the first substrate. This is because the second substrate having an insulator film on its surface opposing to the first substrate is arranged to face the first substrate. Thus, the migration of silicon (Si) is suppressed, which makes it possible to selectively form a silicon (Si)-containing film with a flat surface at least on the semiconductor region of the first substrate in a reliable manner.

Another Embodiment

A method of manufacturing a semiconductor device according to another embodiment of the present disclosure includes first and second steps of forming a silicon (Si)-containing film. The first step is configured to convey a first substrate provided with an opposing surface having insulator regions and a semiconductor region exposed between the insulator regions and a second substrate provided with an insulator surface exposed toward the opposing surface of the first substrate, into a reaction chamber in a state that the second substrate is arranged to face the opposing surface of the first substrate. The second step is configured to selectively form a silicon-containing film with a flat surface at least on the semiconductor region of the opposing surface of the first substrate by heating the inside of the reaction chamber and supplying at least a silicon-containing gas and a chlorine-containing gas into the reaction chamber.

The silicon-containing film is, e.g., an epitaxial film of silicon (Si) or silicon germanium (SiGe). The silicon-containing film may be formed at least on the first substrate, more particularly on the semiconductor region of the first substrate. Accordingly, a dummy substrate having an insulator surface exposed toward the opposing surface of the first substrate can be used as the second substrate, and a product substrate having insulator regions and a semiconductor region exposed between the insulator regions can be used as the first substrate. In one embodiment, the silicon-containing film may be formed not only on the first substrate but also on a semiconductor region of the second substrate. In this case, identical product substrates can be used as the first substrate and the second substrate. The product substrate may refer to a substrate from which semiconductor devices such as ICs are actually manufactured. The dummy substrate may refer to a substrate used to prevent deterioration of film formation. For this purpose, two dummy substrates are arranged above and below the product substrate so that the product substrate can be interposed therebetween.

According to the method of the present embodiment, if a silicon (Si)-containing gas and a chlorine (Cl)-containing gas are supplied into a heated reaction chamber, chlorine (Cl) components exhibiting increased surface coverage are chlorine (Cl)-terminated at least in a growth region, namely in the semiconductor region of the first substrate. This is because the second substrate having an insulator film on its surface opposing to the first substrate is arranged to face the first substrate. Thus, the migration of silicon (Si) is suppressed, which makes it possible to selectively form a silicon (Si)-containing film with a flat surface at least on the semiconductor region of the first substrate in a reliable manner.

In the second step mentioned above, a material formed by decomposition of the silicon-containing gas and the chlorine-containing gas in a gaseous layer within the reaction chamber may be adsorbed to at least the rear surface of the second substrate and the semiconductor region of the first substrate. In this regard, the gases decomposed in the gaseous layer within the reaction chamber may be, e.g., a silane ($SiH_4$) gas, a disilane ($Si_2H_6$) gas, a dichlorosilane ($SiH_2Cl_2$) gas or a germane ($GeH_4$) gas. The material formed by decomposition of the silicon-containing gas and the chlorine-containing gas in the gaseous layer within the reaction chamber may be, e.g., silicon (Si) or silicon germanium (SiGe).

Since the material formed by decomposition is adsorbed to the rear surface of the second substrate and the semiconductor region of the first substrate, it is possible to selectively form a silicon-containing film with a flat surface on the semiconductor region of the first substrate in a reliable manner.

Further Embodiment

While the silicon (Si)-containing film is formed at least on the first substrate in the embodiments described above, an additional silicon (Si)-containing film may be formed on the second substrate. In this case, the second substrate is configured such that a semiconductor region is exposed between insulator regions on the opposite surface of the second substrate from the opposing surface of the first substrate. This makes it possible to selectively form a silicon-containing film with a flat surface even on the semiconductor region of the second substrate in a reliable manner.

Still Further Embodiment

While the silicon (Si)-containing film is formed on the first substrate or the second substrate in the embodiments described above, the first substrate and the second substrate may be identical with each other and a plurality of identical substrates may be conveyed into a reaction chamber to form silicon (Si)-containing films on the respective substrates.

To this end, the method of manufacturing a semiconductor device according to the present embodiment may include: providing a plurality of substrates, the front surface of the each substrates having insulator regions and a semiconductor region arranged between the insulator regions, at least the semiconductor region of the front surface being covered with an oxide film, the rear surface of the each substrates being covered with an oxide film; removing the oxide film formed on the semiconductor region of the front surface of each of the substrates while keeping intact the oxide film formed on the rear surface of each of the substrates; and conveying the substrates, in which the oxide film formed on the semiconductor region is removed while the oxide film formed on the rear surface remaining intact, into a reaction chamber in a state that the substrates are stacked one above another at a predetermined interval.

According to this method, the substrates in which the oxide film formed on the rear surface remains intact can be stacked one above another. This makes it possible to simultaneously form, within the reaction chamber, silicon-containing films on the semiconductor regions of a plurality of substrates in a reliable manner.

Yet Still Further Embodiment

A substrate holder can be used to convey a plurality of stacked substrates into a reaction chamber. To this end, in the present embodiment, a substrate holder holding the substrates vertically stacked one above another at a predetermined interval may be conveyed into the reaction chamber in the conveying step mentioned above, each of the substrates provided with a front surface having insulator regions and a semiconductor region exposed between the insulator regions and a rear surface formed of an exposed insulator surface. According to this method, silicon-containing films are formed on the semiconductor regions of the substrates held by the substrate holder within the reaction chamber. This makes it possible to process an increased number of substrates that can be conveyed by the substrate holder, thereby greatly enhancing the throughput.

In one embodiment, the insulator regions and the semiconductor region may be formed at different heights. If the insulator regions are substantially flush with the semiconductor region, the silicon (Si)-containing layers selectively formed on the semiconductor region can have a flat surface.

[Substrate Processing Apparatus]

A substrate processing apparatus for implementing one process of the above-described semiconductor device manufacturing method is configured as follows.

One Embodiment

A substrate processing apparatus according to one embodiment of the present disclosure includes a reaction chamber, a first gas supply system, a second gas supply system, a heater and a controller.

The reaction chamber is defined within a process vessel. A first substrate and a second substrate are arranged to be processed within the reaction chamber. The first gas supply system serves to supply a silicon-containing gas into the reaction chamber. The second gas supply system serves to supply a chlorine-containing gas into the reaction chamber. The heater serves to heat the substrates to a processing temperature. The heater is configured by, e.g., a resistance heater.

The controller is configured to control the heater, the first gas supply system and the second gas supply system such that a silicon-containing gas and a chlorine-containing gas are supplied between a first substrate, which is provided with an opposing surface having insulator regions and a semiconductor region exposed between the insulator regions, and a second substrate, which is provided with an exposed insulator surface and arranged in an opposing relationship with the opposing surface of the first substrate, to selectively form a silicon-containing film with a flat surface on the semiconductor region of the first substrate.

With this configuration, the first substrate and the second substrate arranged within the reaction chamber are heated by the heater controlled by the controller. If the silicon-containing gas and the chlorine-containing gas are supplied between the first substrate and the second substrate by the first gas supply system and the second gas supply system under the control of the controller, chlorine components exhibiting increased surface coverage are chlorine (Cl)-terminated in a growth region, namely in the semiconductor region of the first substrate. Thus, the migration of silicon (Si) is suppressed, which makes it possible to selectively form a silicon (Si)-containing film with a flat surface at least on the semiconductor region of the first substrate in a reliable manner.

Specific Example

The substrate processing apparatus according to one embodiment of the present disclosure will be described in detail with reference to the accompanying drawings.

Figure 2:
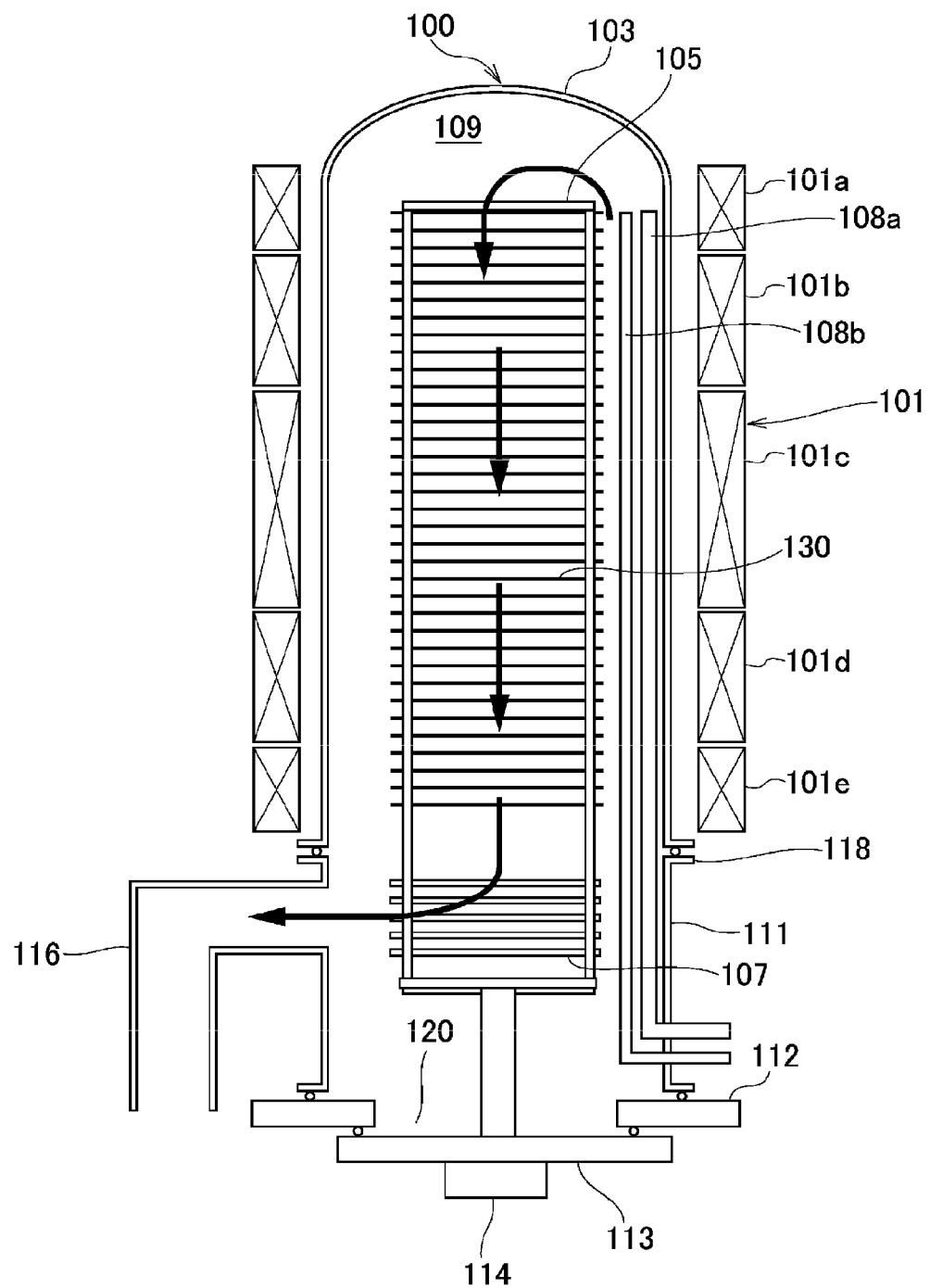
FIG. 2 is a schematic view showing a reaction furnace according to the first embodiment.

FIG. 1 is a schematic vertical section view showing a hot-wall type vertical low-pressure CVD apparatus, one specific example of the substrate processing apparatus for implementing one process of the semiconductor device manufacturing method according to the present embodiment. FIG. 2 is a schematic vertical section view showing a reaction furnace employed in the hot-wall type vertical low-pressure CVD apparatus according to the present embodiment.
(Hot-Wall Type Vertical Low-Pressure CVD Apparatus)

As shown in FIG. 1, the hot-wall type vertical low-pressure CVD apparatus 180 according to the present embodiment includes a reaction furnace 100, a control device 141 (used as a controller), a gas supply device 142 and a vacuum exhaust device 143. The reaction furnace 100 includes a reaction vessel 104, a heater 101 provided outside the reaction vessel 104 and an insulating material 102 provided to cover the heater 101 and the reaction vessel 104.

An exhaust pipe 116 is attached to the sidewall of the reaction vessel 104 and is connected to the vacuum exhaust device 143. A nozzle 108 is provided to pass through the reaction vessel 104. A supply pipe 115 connected to the nozzle 108 is provided outside the reaction vessel 104. The supply pipe 115 is connected to the gas supply device 142. A source gas for selective growth of a Si film or a SiGe film is supplied to the nozzle 108 through the supply pipe 115 and is introduced into the reaction vessel 104 from the nozzle 108. The gas introduced into the reaction vessel 104 is exhausted from the exhaust pipe 116 by the vacuum exhaust device 143.

A boat 105 (used as a substrate holder) is loaded into and unloaded from the reaction vessel 104. If the boat 105 is lifted up and loaded into the reaction vessel 104, the furnace opening of the reaction vessel 104 is closed. If the boat 105 is lowered down and unloaded from the reaction vessel 104, the furnace opening is closed by a gate valve 117. A transfer machine 151 is provided for transferring wafers 130 between the boat 105 (which is unloaded from the reaction furnace 100) and a wafer cassette 152 accommodating the wafers 130.
(Reaction Furnace)

The detailed configuration of the reaction furnace 100 is shown in FIG. 2. The reaction furnace 100 includes a base 112, a manifold 111 provided above the base 112, a reaction tube 103 and a heater 101 provided outside the reaction tube 103. A reaction chamber 109 is defined within the reaction tube 103. The entire inside of the reaction tube 103 is heated by the heater 101. The reaction tube 103 is provided on an upper flange 118 of the manifold 111. The reaction vessel 104 mentioned above is configured by the reaction tube 103 and the manifold 111.

The heater 101 for heating the reaction tube 103 are divided into five elements, e.g., a top heater 101a, a central upper heater 101b, a center heater 101c, a central lower heater 101d and a bottom heater 101e. The internal temperature of the reaction furnace 100 is controlled by the control device 141. Alternatively, the heater 101 may not be divided but provided as one integrated body.

The boat 105 is placed on a seal cap 113. The boat 105 held by the seal cap 113 is loaded through the opening 120 of the base 112. The opening 120 is configured to be closed by the seal cap 113 as the seal cap 113 moves upward. When the opening 120 is closed, the boat 105 is positioned within the reaction tube 103. The boat 105 is rotated by a rotation mechanism 114. The wafers 130 are vertically stacked one above another in the boat 105. The inside of the reaction tube 103 serves as the reaction chamber 109 within which the wafers 130 are subjected to processing. Heat shield panels 107 are arranged in the lower portion of the boat 105 at a height corresponding to the height of the manifold 111. Once the seal cap 113 is moved down and the boat 105 is unloaded from the reaction vessel 104, the opening 120 of the base 112 is closed by the gate valve 117 (see FIG. 1).

First and second nozzles 108a and 108b are provided within the reaction vessel 104 along the boat 105. The first and second nozzles 108a and 108b are inserted into the reaction tube 103 from the lower portion of the manifold 111. The first nozzle 108a composes a first gas supply system for supplying a silicon-containing gas. The second nozzle 108b composes a second gas supply system for supplying a chlorine-containing gas. A nozzle for supplying a carrier gas therethrough is also provided but is not shown for simplicity. An exhaust pipe 116 is attached to the sidewall of the manifold 111.

For the selective growth of a film of silicon (Si) or silicon germanium (SiGe), a silicon (Si)-containing gas as a source gas is introduced from the first nozzle 108a. In case of selective growth of a silicon (Si)-containing film, the silicon (Si)-containing gas may be, e.g., a silane ($SiH_4$) gas, a disilane ($Si_2H_6$) gas or a dichlorosilane ($SiH_2Cl_2$) gas. In case of selective growth of a silicon germanium (SiGe)-containing film, the silicon (Si)-containing gas is added with a germanium (Ge) such as germane ($GeH_4$).

In addition to the silicon (Si)-containing gas and the germanium (Ge)-containing gas, a chlorine (Cl)-containing gas is introduced from the second nozzle 108b to assure increased selectivity. A chlorine ($Cl_2$) gas or a hydrogen chloride (HCl) gas may be used as the chlorine (Cl)-containing gas.

The source gas introduced into the top portion of the reaction tube 103 from the first nozzle 108a or the second nozzle 108b flows down within the reaction tube 103 past the wafers 130 as substrates stacked one above another. Then, the source gas is exhausted from the exhaust pipe 116 arranged in the lower portion of the reaction tube 103.

A temperature control unit configured to control the heater 101, a gas flow rate control unit configured to control the gas supply device 142, a pressure control unit configured to control the vacuum exhaust device 143 and a drive control unit configured to control the rotation mechanism 114, the gate valve 117 and the transfer machine 151 are electrically connected to a main control unit configured to control the entire operation of the hot-wall type vertical low-pressure CVD apparatus 180. The temperature control unit, the gas flow rate control unit, the pressure control unit and the drive control unit configure a controller 141.

In the hot-wall type vertical low-pressure CVD apparatus 180 described above, the wafers (Si substrates) 130 held in the wafer cassette 152 are transferred from the wafer cassette 152 to the boat 105 by the transfer machine 151. If all the wafers 130 are completely transferred, the boat 105 is loaded into the reaction vessel 104. The inside of the reaction vessel 104 is depressurized by the vacuum exhaust device 143. Then, the wafers 130 are heated by the heater 101 to a desired temperature, e.g., 400° C. or less. If the temperature becomes stable, a source gas is supplied by the gas supply device 142 through the supply pipe 115 and the nozzle 108. As a result, a CVD reaction is caused to occur so that a silicon (Si) film or a silicon germanium (SiGe) film as a semiconductor film with a flat surface can grow on each of the wafers (Si substrates) 130 in a reliable manner.

The following is a description on a first embodiment of a mechanism by which a silicon (Si)-containing film with a flat surface is selectively formed on the semiconductor region of the first substrate, with reference to the accompanying drawings.

First Embodiment

This embodiment is related to a case in which a product Si wafer is used as a first substrate and a dummy Si wafer differing from the product Si wafer is used as a second substrate.

Figure 3:
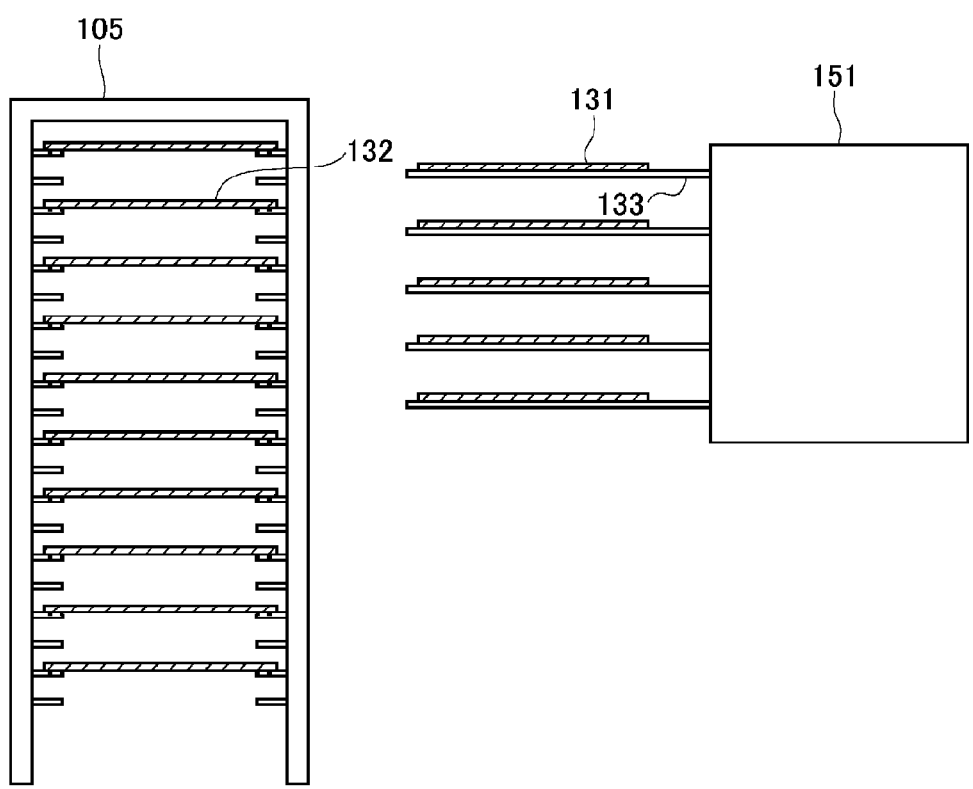
FIG. 3 is a schematic vertical section view of a boat in which a wafer transfer operation is performed, and dummy wafers each having an exposed insulator surface are placed immediately above product wafers, according to a second embodiment of the present disclosure.

FIG. 3 is a schematic explanation view showing a boat according to one embodiment of the present disclosure and a transfer machine configured to transfer a plurality of wafers to and from the boat. The boat 105 unloaded from the reaction furnace waits below the reaction furnace. The transfer machine 151 is provided adjacent to the boat 105. The transfer machine 151 is configured to hold a plurality of, e.g., five, wafers 130 with a corresponding number of tweezers 133 and transfer them to the boat 105 at one time.

The wafers 130 include product Si wafers 131 and dummy Si wafers 132. The product Si wafers 131 may refer to wafers from which semiconductor devices such as ICs are actually manufactured. The dummy Si wafers 132, which differ from the product Si wafers 131, are arranged above and below the respective product Si wafers 131 so that the product Si wafers 131 can be interposed between the dummy Si wafers 132. The dummy Si wafers 132 serve to prevent heat from dissipating from around the product Si wafers 131 and prevent fine particles or contaminants scattering around the product Si wafers 131 from adhering thereto. The dummy Si wafers 132 may refer to wafers for preventing deterioration of film formation which may be caused by turbulent gas flow or uneven temperature distribution. In FIG. 3, the dummy Si wafers 132 are vertically stacked one above another in the boat 105. The respective product Si wafers 131 transferred by the transfer machine 151 are inserted and arranged between the corresponding upper and lower dummy Si wafers 132. As a result, each of the dummy Si wafers 132 provided with an exposed insulator surface is arranged immediately above a corresponding one of the product Si wafers 131. The dummy Si wafers mentioned above are often referred to as sandwiching dummy wafers because they are configured to sandwich the product Si wafers.

In this embodiment, the product Si wafers 131 are silicon (Si) wafers each provided with a front surface (major surface) having a semiconductor silicon (Si) region to be subjected to selective growth. The semiconductor silicon (Si) region is formed between insulator regions made of silicon oxide ($SiO_2$) or silicon nitride (SiN). The respective dummy Si wafers 132 are arranged in a parallel to face the major surfaces of the corresponding product Si wafers 131 to be subjected to selective growth. Dummy silicon (Si) wafers each having a nitride film (a SiN film or a $Si_3N_4$ film) exposed at least on the rear surface thereof are prepared as the dummy Si wafers 132.

In one process of a semiconductor device manufacturing method to form a silicon (Si)-containing film, at least one product Si wafer and at least one dummy Si wafer having a SiN film (or a $Si_3N_4$ film) exposed at least on the rear surface thereof are accommodated within a reaction chamber in such a state that the rear surface of the dummy Si wafer is arranged to face the surface of the product Si wafer to be subjected to selective growth.

Next, the product Si wafer and the dummy Si wafer accommodated within the reaction chamber are heated by a heater arranged outside the reaction chamber. Concurrently, a process gas is supplied into the reaction chamber from a process gas supply system while exhausting the process gas out of the reaction chamber. At this time, a material formed by decomposition of the process gas in a gaseous layer within the reaction chamber is adsorbed to the SiN film (or the $Si_3N_4$ film) on the rear surface of the dummy Si wafer and also to the Si region of the product Si wafer, thereby allowing a Si-containing film to selectively grow on the Si region.

In case of selective growth of Si or SiGe, the selectively growing silicon (Si)-containing film may be, e.g., an elevated source/drain of a MOSFET.

Figure 9:
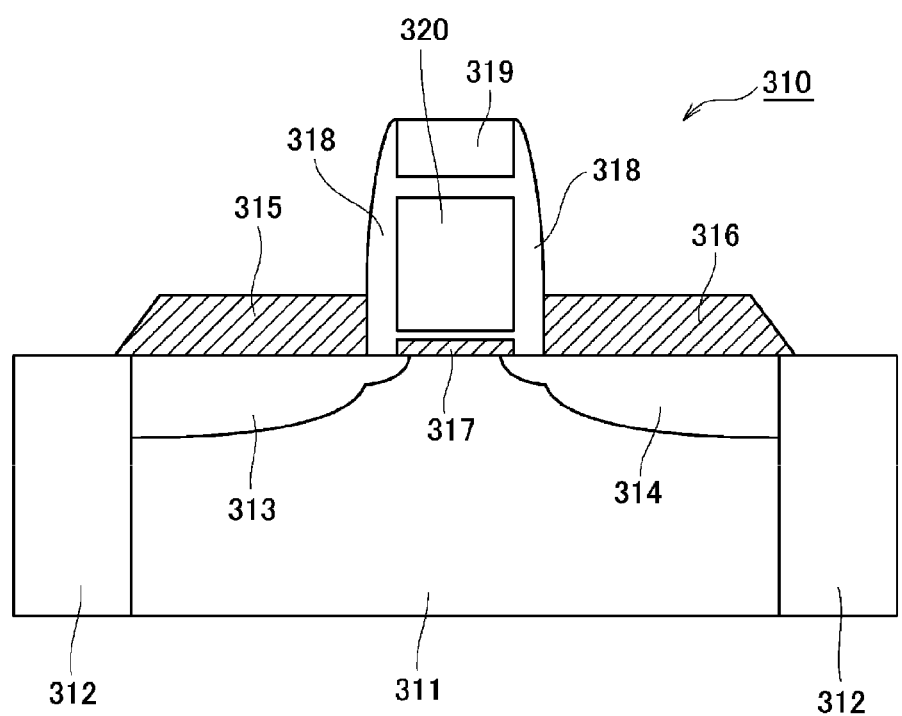
FIG. 9 is a schematic vertical section view of a MOSFET structure having a typical elevated source/drain.

FIG. 9 is a schematic vertical section view showing a MOSFET 310 having an elevated source/drain formed thereon. On a device-forming silicon region 311 surrounded by a device isolation region 312, a gate electrode 320 is formed through a gate insulation film 317. A sidewall 318 is formed on the side surface of the gate electrode 320. A gate protection film 319 is formed on the top surface of the gate electrode 320. In the device-forming silicon region 311, a source 313 and a drain 314 are formed in a self-aligning manner with respect to the gate electrode 320. An elevated source 315 and an elevated drain 316 are selectively formed only on the source 313 and the drain 314. The elevated source 315 and the elevated drain 316 are formed by a technique generally referred to as selective growth, in which Si or SiGe is allowed to epitaxially grow only on the source 313 and the drain 314 exposing Si while any material is not allowed to grow on the device isolation region 312 exposing $SiO_2$ or SiN.

In case where a silicon (Si)-containing film such as an elevated source or an elevated drain is allowed to selectively grow on the silicon (Si) region at a relatively great thickness, the degree of selective growth depends largely on whether the opposing surface (e.g., a substrate surface opposing the selectively grown film) is a silicon-based film or an insulator-based film.

Figure 4A:
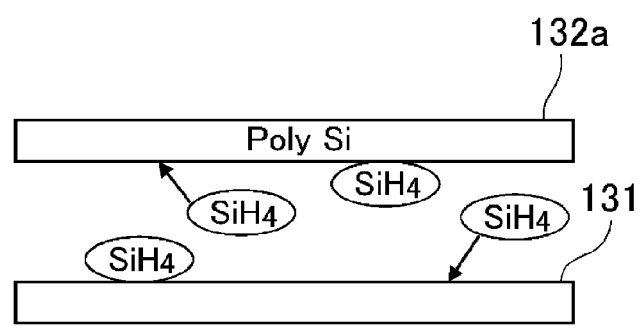
FIGS. 4A and 4B are schematic views showing different gas reactions according to the first embodiment, which depends on a difference in the type of an opposing surface.
Figure 4B:
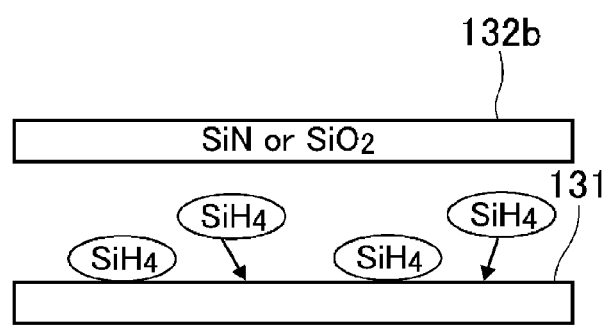

FIGS. 4A and 4B are schematic views showing different gas reactions in case where the opposing surface is formed of a silicon (Si)-based material such as polysilicon (poly-Si) or the like (FIG. 4A) and in case where the opposing surface is formed of an insulator-based material such as SiN or $SiO_2$ (FIG. 4B). If a silicon (Si)-containing film such as an elevated source/drain or an embedded source/drain needs to have a thickness of, e.g., 500 Å or more in the selective growth of Si or SiGe, the surface of the dummy Si wafer 132a opposing the product Si wafer 131 is made of a silicon (Si)-based material such as polysilicon (poly-Si) or the like as shown in FIG. 4A. This enables active species (e.g., $SiH_4$) to be adsorbed to the opposing surface of the product Si wafer 131, which makes it possible to maintain selectivity. On the other hand, if the surface of the dummy Si wafer 132b opposing the product Si wafer 131 is made of an insulator-based material such as SiN or $SiO_2$ (FIG. 4B), it is highly probable that a reaction with silicon nitride (SiN) or silicon oxide ($SiO_2$) occurs above the product Si wafer. This shortens a latent period, which prevents the selective growth or the thickness of a film that can be formed by the selective growth becomes extremely small.

In contrast, when the selective growth of silicon (Si) or silicon germanium (SiGe) is performed to form a thin film, an insulator-based film of silicon nitride (SiN) or silicon oxide ($SiO_2$) may be exposed on the surface of the dummy Si wafer opposing the product Si wafer. For example, when a silicon (Si)-containing film is caused to grow on the semiconductor region of the product Si wafer exposed between the insulator regions to have a height greater than the height of the insulator regions, the migration of silicon (Si) is suppressed even if the selective growth of silicon (Si) or silicon germanium (SiGe) is performed to form a thin film of, e.g., about 100 Å. Therefore, if the surface of the dummy Si wafer opposing the product Si wafer is made of silicon nitride (SiN) or silicon oxide ($SiO_2$) and if a silicon-containing gas and a chlorine-containing gas are supplied into the reaction chamber, it becomes possible to form a flat epitaxial film in a reliable manner.

The above process will be described in more detail with reference to FIG. 5. The source gas used in this example is a silane ($SiH_4$) gas added with a germane ($GeH_4$) gas and a hydrogen chloride (HCl) gas. Under the epitaxial growth conditions of predetermined temperature, pressure and flow rate, the source gas is thermally decomposed on the semiconductor region (silicon (Si) region) of the product Si wafer, thereby epitaxially and selectively growing a monocrystalline film of silicon germanium (SiGe) only on the silicon (Si) region.

Figure 5A:
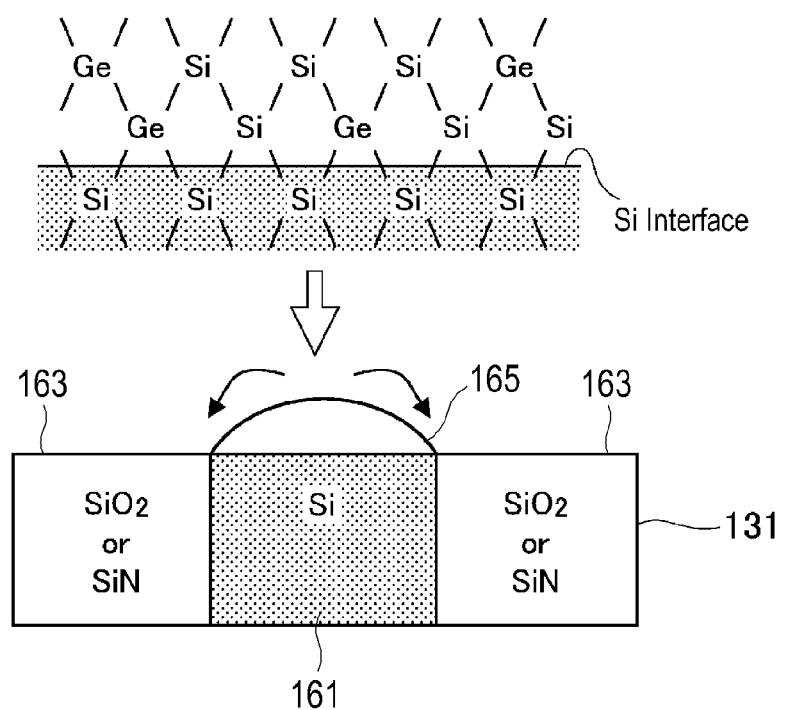
FIGS. 5A and 5B are schematic views showing different epitaxial films according to the first embodiment, which depends on a difference in the type of an opposing surface.

As shown in FIG. 5A, if the surface of the dummy Si wafer 132a opposing the product Si wafer 131 is made of a silicon (Si)-based material such as polysilicon (poly-Si) or the like, a SiGe epitaxial film 165 formed on the silicon (Si)-made semiconductor region 161 of the product Si wafer 131 (which is exposed between the insulator regions 163 made of silicon oxide ($SiO_2$) or silicon nitride (SiN)) may not be maintained to be flat, but become a round shape (e.g., a bulging or convex shape). This is because the Cl components of a source gas, e.g., a silane ($SiH_4$) gas, are consumed not only by the semiconductor region 161, i.e., the growth surface, of the product Si wafer 131 but also by the rear surface of the dummy Si wafer 132a positioned above the semiconductor region 161, consequently accelerating the migration of silicon (Si) and reducing the surface coverage of the Cl components on the product Si wafer 131.

Figure 5B:
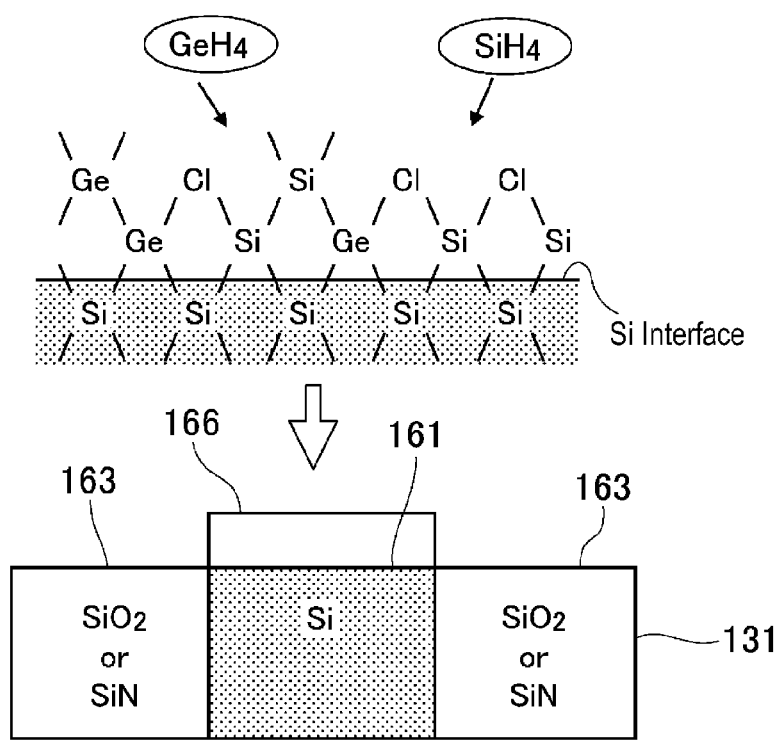

In contrast, as shown in FIG. 5B, if the surface of the dummy Si wafer opposing the product Si wafer 131 is made of an insulator-based film of silicon nitride (SiN) or silicon oxide ($SiO_2$), a flat SiGe epitaxial film 166 is formed on the silicon (Si)-made semiconductor region 161 of the product Si wafer 131 exposed between the insulator regions 163 made of silicon oxide ($SiO_2$) or silicon nitride (SiN). This is because the Cl components of silane ($SiH_4$) are sufficiently supplied onto the product Si wafer 131. For this reason, the Cl components with increase surface coverage are Cl-terminated on the growth region of the product Si wafer 131 during the selective growth of silicon (Si) or silicon germanium (SiGe), thereby suppressing the migration of silicon (Si). The Cl-terminated Cl components are substituted by active species such as silane ($SiH_4$) or germane ($GeH_4$), which eliminates the possibility that the Cl components remain in the film. According to the above process, the surface of the dummy Si wafer facing the product Si wafer is formed of an insulation film, thereby improving the flatness of the film formed on the semiconductor region of the product Si wafer.

Although germanium (Ge) is used as a source material in the example shown in FIGS. 5A and 5B, silicon (Si) may be used instead of germanium (Ge). In this case, germanium (Ge) in the plan crystal structure diagram shown in FIGS. 5A and 5B may be replaced by silicon (Si). With this arrangement, a silicon (Si) epitaxial film may be formed instead of the silicon germanium (SiGe) epitaxial film formed in the above example.

(Process Conditions)

In the first embodiment described above, the process conditions for the selective growth of silicon (Si) or silicon germanium (SiGe) may be set as follows. For example, the flow rate of the silicon (Si)-containing gas may be in a range of from 50 sccm to 1,000 sccm, the flow rate of the germanium (Ge)-containing gas may be in a range of from 0 sccm to 500 sccm, the flow rate of the chlorine (Cl)-containing gas may be in a range of from 10 sccm to 200 sccm, the flow rate of the hydrogen ($H_2$) gas may be in a range of from 0 slm to 20 slm, the internal temperature of the reaction chamber may be in a range of from 450° C. to 700° C. and the internal pressure of the reaction chamber may be in a range of from 10 Pa to 100 Pa.

Effects of the First Embodiment

According to the present embodiment, the first substrate and the second substrate are used. The second substrate is arranged immediately above the first substrate. The rear surface of the second substrate is formed of an insulation film (SiN or $SiO_2$). In this state, at least a silane ($SiH_4$) gas and a hydrogen chloride (HCl) gas are supplied between the first substrate and the second substrate. As a result, a silicon (Si) film is allowed to selectively grow on the Si region of the front surface of the first substrate, and at this time, the migration of silicon (Si) is suppressed by the chlorine (Cl) components contained in the hydrogen chloride (HCl) gas. Accordingly, it is possible to form a silicon (Si) film with a flat surface in a reliable manner.

In the first embodiment described above, the insulator surface of the second substrate is exposed toward the opposing surface of the first substrate. In this configuration, the rear surface of the first substrate, i.e., the product wafer, may be formed of SiN or $SiO_2$. However, if a Si-based film is exposed on the rear surface of the product wafer, the opposing surface of the product wafer, which is arranged immediately above the rear surface of the product wafer, needs to be formed of an insulation film of SiN or $SiO_2$.

Second Embodiment

The following is a description on certain methods (first to third methods) of forming a substrate surface opposing the product Si wafer with an insulation film as according to a second embodiment.

(First Method)

In this method, the first substrates and the second substrates are different types of substrates (see FIG. 3). Only the second substrates are subjected to insulation film formation processing in advance so that the opposing surface of each of the second substrates has an insulator surface.

In case where the respective dummy Si wafers (sandwiching dummy wafers) 132 each having a SiN film or a $SiO_2$ film formed as a insulator surface are arranged immediately above the corresponding product Si wafers 131, the boat 105 holding the dummy Si wafers 132 stacked one above another at a pitch twice as great as a normal pitch is loaded into the reaction furnace 100. Prior to loading the product Si wafers 131, a source gas is supplied to form insulation films such as SiN films or $SiO_2$ films on the front and rear surfaces of the respective dummy Si wafers 132 including the opposing surfaces. Thereafter, the boat 105 is taken out from the reaction furnace 100. Subsequently, the product Si wafers 131 are inserted between the dummy Si wafers 132 held by the boat 105. The boat 105 is loaded into the reaction furnace 100 once again to perform selective growth of silicon-containing films on the product Si wafers 131. According to this method, the reaction furnace with the same configuration as the furnace for formation of silicon-containing films is used to form the insulation films. This makes it possible to reliably form insulation films on the surfaces of the dummy Si wafers opposing to the product Si wafers.

(Second Method)

This method is the same as the first method in that the first substrates and the second substrates are different types of substrates, but differs from the first method in that the opposing surfaces of the second substrates are formed of insulator surfaces by subjecting the reaction tube accommodating the second substrates to insulation film formation processing in advance.

In particular, the boats each holding the dummy Si wafers stacked one above another at a pitch twice as great as a normal pitch are loaded into the respective reaction tube in advance. The boat and the dummy Si wafers loaded into the reaction tube is coated with insulation films such as SiN films or $SiO_2$ films. Thereafter, the boat is taken out from the reaction tube. Subsequently, the product Si wafers are inserted between the dummy Si wafers held by the boat. The boat is loaded into the reaction tube once again to perform selective growth of silicon-containing films on the product Si wafers.

According to this method, the insulation films are coated not only on the dummy Si wafers but also the boat and the reaction tube. This makes it easy to perform the film coating process as compared with the first method in which only the dummy Si wafers are coated with the insulation films. Inasmuch as the insulator surfaces are exposed not only in the dummy Si wafers arranged immediately above the product Si wafers but also in the members arranged around the product Si wafers, it is possible to surely suppress the migration of silicon (Si) and to selectively form, within the reaction chamber, a silicon-containing film with a flat surface on the semiconductor region of the first substrate in a reliable manner.

(Third Method)

In this method, the same type of the product Si wafers are used as either of the first substrate and the second substrate. The front surface of each of the product Si wafers of the same type is formed to have a semiconductor region and the rear surface thereof is formed to have an insulation film. To this end, the third method includes: providing a plurality of product Si wafers, the front surface of each of the product Si wafers having insulator regions and a semiconductor region arranged between the insulator regions, at least the semiconductor region of the front surface being covered with an oxide film, the rear surface of each of the product Si wafers being covered with an oxide film; removing the oxide film formed on the semiconductor region of the front surface of each of the product Si wafers while keeping intact the oxide film formed on the rear surface of each of the product Si wafers; and conveying the product Si wafers, in which the oxide film formed on the semiconductor region is removed with the oxide film formed on the rear surface remaining intact, into a reaction chamber in a state that the product Si wafers are stacked one above another at a predetermined interval.

According to this method, the opposing surface of a substrate (e.g., a rear surface of a upper product Si wafer opposing a front surface of a lower product Si wafer) can be formed to have an insulation film by keeping intact the oxide film formed on the rear surface of each of the product Si wafers. Since the product Si wafers in which the oxide film formed on the rear surface remains intact are stacked one above another in the boat, it is possible to form, within the reaction chamber, silicon-containing films on the semiconductor regions of a plurality of substrates (e.g., product Si wafers) at one time.

In the oxide film removing operation mentioned above, water may be supplied to the rear surface of each of the product Si wafers while supplying a hydrofluoric-acid-containing material to the front surface of each of the product Si wafers, in order to remove the oxide film formed on the semiconductor region of the front surface while keeping intact the oxide film formed on the rear surface. If water is supplied to the rear surface while supplying the hydrofluoric-acid-containing material to the front surface, it is possible to prevent the hydrofluoric-acid-containing material from flowing toward the rear surface and thus effectively keep intact the oxide film formed on the rear surface.

One process of a semiconductor device manufacturing method incorporating the third method mentioned above may be implemented as follows. In particular, the third method includes: a first step of providing a plurality of product Si wafers having front and rear surfaces with oxide films formed thereon and cleaning the front and rear surfaces of the product Si wafers with DHF (diluted hydrofluoric acid) to remove the oxide films; a second step of accommodating the product Si wafers within a reaction chamber in a state that the product Si wafers having Si regions exposed on the rear surfaces thereof are stacked one above another with the front surface of each of the product Si wafers arranged in an opposing relationship with the rear surface of the adjoining product Si wafer; and a third step of heating the product Si wafers accommodated within the reaction chamber with a heater arranged outside the reaction chamber, supplying a process gas into the reaction chamber from a process gas supply system and exhausting the process gas from the reaction chamber. In the third step, a material formed by decomposition of the process gas in a gaseous layer within the reaction chamber is adsorbed to the rear surfaces of the product Si wafers and on the Si regions of the product Si wafers, thereby causing Si-containing films to selectively grow on the Si regions.

In the film formation step mentioned above, it is possible to selectively form silicon-containing films with a flat surface on the semiconductor regions of a plurality of substrates at one time.

More specifically, the oxide film removing step in one process of a semiconductor device manufacturing method may be implemented as follows.

Figure 6A:
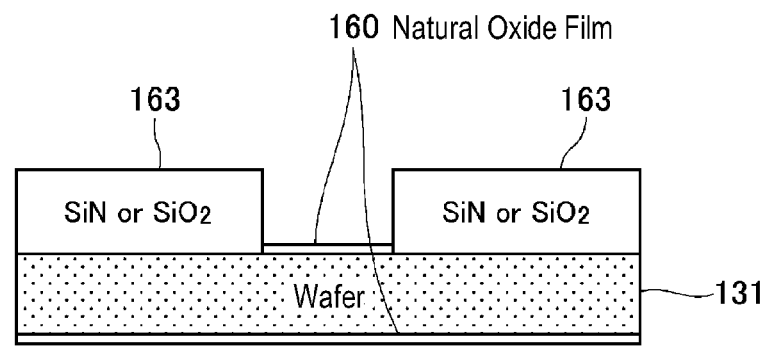
FIGS. 6A, 6B and 6C are views showing an oxide film removal process for removing an oxide film formed on the front surface of a wafer and for removing an oxide film formed on the rear surface of a wafer according to the second embodiment.
Figure 6B:
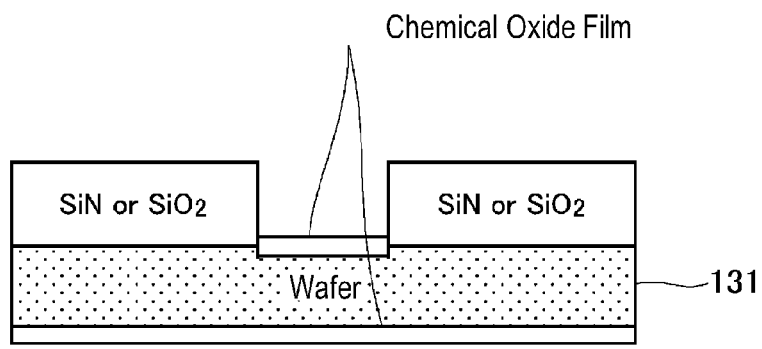
Figure 6C:
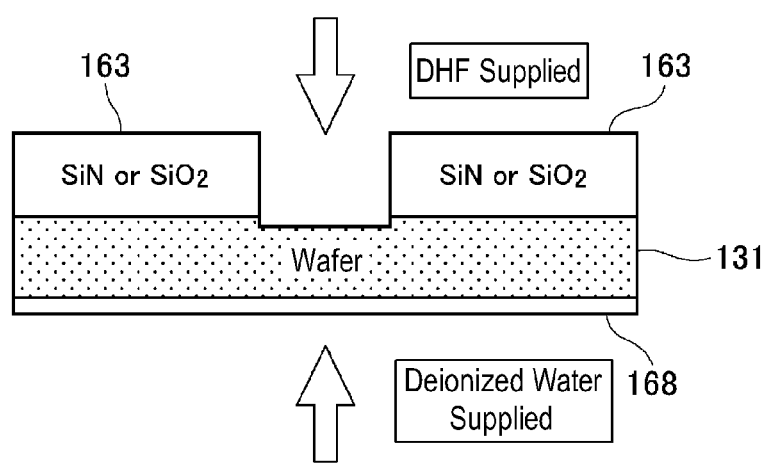

Selective growth can be performed by allowing a chemical oxide film to grow on the rear surface of a product Si wafer. FIGS. 6A to 6C schematically show an oxide film removal step of removing an oxide film grown on the rear surface of a product wafer. The product wafer is subjected to wet cleaning before it is loaded into a furnace of a hot-wall type vertical low-pressure CVD apparatus. At this time, the product wafer is cleaned by a unit-wafer-type cleaning device. The cleaning device performs pre-treatment cleaning and then DHF cleaning. In general, a spin cleaning method is employed in which a product wafer is cleaned while spinning the same.

The pre-treatment cleaning is performed in the order of SC-1 cleaning (ammonia hydrogen peroxide water cleaning: ammonia ($NH_3$)+hydrogen peroxide ($H_2O_2$)+water ($H_2O$)) and SC-2 cleaning (hydrochloric acid hydrogen peroxide water cleaning: hydrogen chloride (HCl)+hydrogen peroxide ($H_2O_2$)+water ($H_2O$)).

After the pre-treatment cleaning, only the front surface of the product wafer is cleaned with DHF (diluted hydrofluoric acid, HF+$H_2O$) in the DHF cleaning step to remove the chemical oxide film. As a result, the chemical oxide film formed on the rear surface of the product wafer remains intact. At this time, deionized water continues to be supplied to the rear surface of the product wafer in order to prevent the DHF from flowing toward the rear surface. Thus, the chemical oxide film formed on the opposing surface is kept intact.

In an alternate embodiment, instead of supplying deionized water to the rear surface of the product wafer, a shield plate for completely isolating the rear surface from DHF may be employed so that DHF cannot reach the rear surface of the product wafer. In lieu of the spin cleaning method mentioned above, it may be possible to employ a conveying-type cleaning method in which a product wafer is conveyed in a horizontal direction during the cleaning step. In this case, DHF is blown toward the front surface of the product wafer and deionized water is blown against the rear surface of the product wafer while conveying the product wafer, thereby preventing the DHF from reaching the rear surface. For further details on the conveying cleaning method, reference is made to Japanese Patent Laid-Open Publication No. 2004-8847.

As described above, by allowing the chemical oxide film to remain on the rear surface of the product Si wafer, it is possible to control a film to selectively grow on the opposing surface of the product Si wafer. In this case, as compared with the second method in which the sandwiching dummy wafers are used, the number of the product Si wafers that can be processed at one time is increased in proportion to the number of the dummy wafers omitted. For example, the number of the product Si wafers that can be conveyed by the boat represents the number of the product Si wafers that can be processed simultaneously. This significantly increases the throughput. More specifically, if a boat capable of conveying 100 wafers is used, only 50 product wafers may be processed in the sandwiching dummy wafer method. In the present method, however, 100 product wafers can be processed at one time.

In the pre-treatment cleaning performed prior to the DHF cleaning, it is possible to implement not only the SC-1 cleaning and the SC-2 cleaning but also ozone ($O_3$) cleaning or sulfuric acid hydrogen peroxide water (sulfuric acid ($H_2SO_4$)+hydrogen peroxide ($H_2O_2$)+water ($H_2O$)) cleaning.

Further, the pre-treatment cleaning performed prior to the DHF cleaning may be employed not only to remove natural oxide films formed on the wafers or impurities existing within or on the natural oxide films but also to form chemical oxide films (which is formed by actively supplying oxide to the wafers and causing a reaction thereby) in place of the natural oxide films with uncontrollable thickness property. However, the pre-treatment cleaning may be omitted if there is no need to remove impurities or if formation of natural oxide films does not matter.

(Substrate Cleaning Device)

In the following, one example of a substrate cleaning device for implementing the oxide film removal step mentioned above will be described in detail. This substrate cleaning device is of a unit-wafer type. A plurality of substrates, the oxide films of which have been removed by the substrate cleaning device, may be conveyed to a hot-wall type vertical low-pressure CVD apparatus in which the substrates are subjected to film formation processing.

Figure 7:
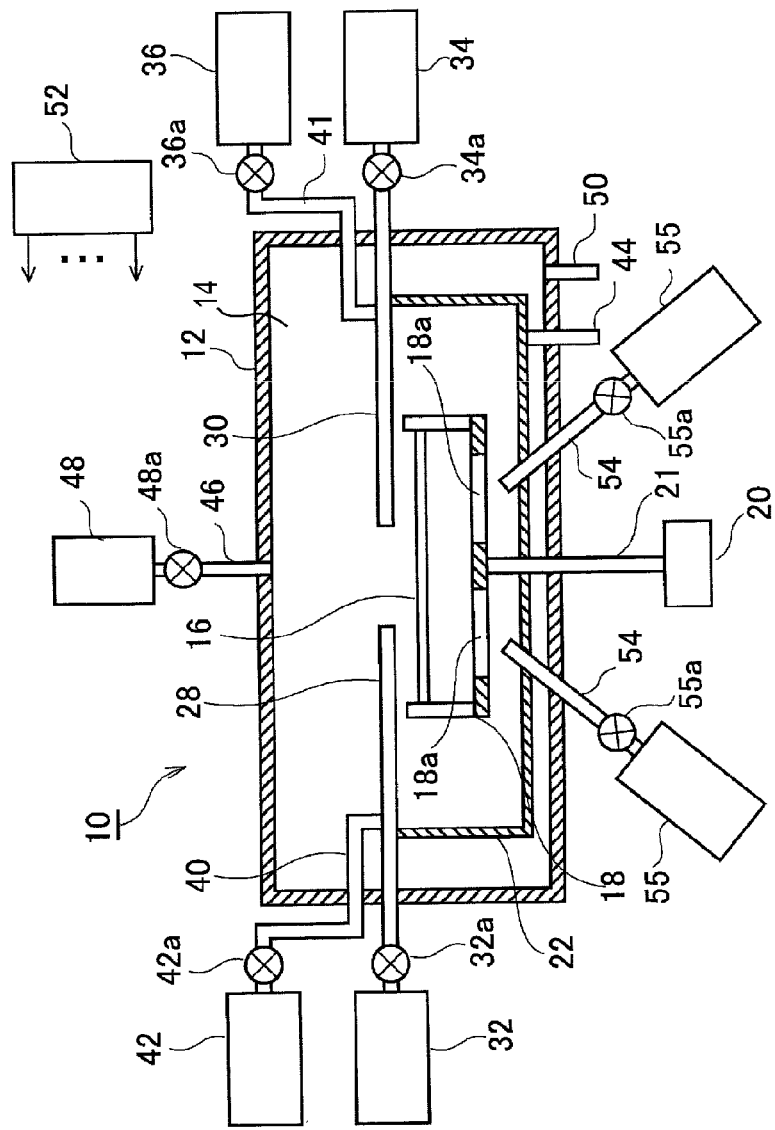
FIG. 7 is a section view showing a substrate cleaning apparatus for implementing the oxide film removal process according to the second embodiment.

One embodiment of a substrate cleaning device 10 is shown in FIG. 7. The substrate cleaning device 10 includes a device body 12 and a cleaning chamber 14 surrounded by the device body 12. A support unit 18 configured to horizontally support a substrate 16 such as a semiconductor wafer is arranged within the cleaning chamber 14. The support unit 18 is connected to a rotation mechanism 20, e.g., a motor, through a rotation shaft 21. The horizontally supported substrate 16 is rotated by the rotation mechanism 20.

The periphery of the support unit 18 is surrounded by a cover 22. As will be described later, the cover 22 is configured to receive chemical solutions flying from the substrate 16 when the substrate 16 is rotated by the support unit 18.

A first nozzle 28 and a second nozzle 30 are inserted into the cleaning chamber 14. The first nozzle 28 and the second nozzle 30 are horizontally arranged such that the tip ends thereof extend to near the center of the substrate 16 supported by the support unit 18.

The first nozzle 28 is connected to a first cleaning solution supply unit 32 configured to supply a cleaning solution made of, e.g., diluted hydrofluoric acid (DHF), through a control valve 32a configured to control the supply of the cleaning solution. The DHF cleaning solution is supplied from the first nozzle 28 toward the center of the substrate 16.

The second nozzle 30 is connected to a second cleaning solution supply unit 34 configured to supply, e.g., an RCA cleaning solution, through a control valve 34a configured to control the supply of the RCA cleaning solution. The RCA cleaning solution is supplied from the second nozzle 30 toward the center of the substrate 16. The RCA cleaning refers to a cleaning method for removing foreign materials, organic materials or metallic contaminants by the combination of cleaning sequences of SC-1 (a mixed solution of $NH_4OH$, $H_2O_2$ and $H_2O$), SC-2 (a mixed solution of HCl, $H_2O_2$ and $H_2O$), diluted hydrofluoric acid (DHF) and SPM (a mixed solution of $H_2SO_4$ and $H_2O_2$).

One ends of a first water supply unit 40 and a second water supply unit 41 are connected to the first nozzle 28 and the second nozzle 30, respectively, and the other ends thereof are connected to a first deionized water supply unit 42 and a second deionized water supply unit 36, respectively. The first water supply unit 40 and the second water supply unit 41 are configured to supply deionized water to the inner surface of the cover 22 through the first nozzle 28 and the second nozzle 30, respectively. Control valves 42a and 46a configured to control the supply of deionized water are provided in the first water supply unit 40 and the second water supply unit 41, respectively.

One or more third nozzles 54 are provided to be inserted into the cleaning chamber 14. The third nozzles 54 are obliquely inserted into the cover 22 through the bottom portion of the device body 12 and the bottom wall of the cover 22 such that the tip ends thereof extend to near openings 18a defined in the bottom wall of the support unit 18. The third nozzles 54 are connected to a third deionized water supply unit 55 through a control valve 55a configured to control the supply of deionized water. Deionized water is supplied from the third nozzles 54 toward the rear surface of the substrate 16 through the openings 18a defined in the bottom wall of the support unit 18.

A drain pipe 44, through which the deionized water supplied to the cover 22 is drained, is connected to the bottom wall of the cover 22. The drain pipe 44 extends to the outside of the device body 12 so that the deionized water existing within the cover 22 can be drained through the drain pipe 44.

One end of a drying gas supply pipe 46 is connected to the top portion of the device body 12. A drying gas supply unit 48 is connected to the other end of the drying gas supply pipe 46. A control valve 48a configured to control the supply of a drying gas is provided in the drying gas supply pipe 46. For example, a nitrogen ($N_2$) gas is used as the drying gas. An exhaust pipe 50, through which the drying gas is exhausted, is connected to the bottom portion of the device body 12.

A controller 52 is configured by a computer and is configured to control the rotation of the support unit 18 driven by the rotation mechanism 20, the supply of the DHF cleaning solution through the first nozzle 28 under the control of the control valve 32a, the supply of the RCA cleaning solution through the second nozzle 30 under the control of the control valve 34a, the supply of the deionized water from the first water supply unit 40 and the second water supply unit 41 under the control of the control valves 42a and 36a, the supply of the deionized water from the third nozzles 54 under the control of the control valve 55a, and the supply of the nitrogen ($N_2$) gas from the drying gas supply pipe 46 under the control of the control valve 48a.

(Unit Wafer Cleaning Method)

Next, a unit wafer cleaning method for cleaning a substrate and removing an oxide film through the use of the aforementioned substrate cleaning device 10, as one process of a semiconductor device manufacturing method, will be described with reference to FIG. 6.

First, a single substrate 16 is conveyed into the cleaning chamber 14 and is prepared on the support unit 18. The rotation of the substrate 16 is performed by rotating the support unit 18, which is driven by the rotation mechanism 20 through the rotation shaft 21. During rotation of the substrate 16, the RCA cleaning solution is supplied from the second nozzle 30 toward the center of the substrate 16. The front and rear surfaces of the substrate 16 are cleaned to remove the natural oxide films 160 formed on the front and rear surfaces of the substrate 16 (see FIG. 6A). At this time, the RCA cleaning solution flows around the substrate 16 to reach the rear surface as well, consequently removing the natural oxide film 160 formed on the rear surface. In the cleaning method employing the RCA cleaning solution, silicon oxide ($SiO_2$) films are formed by hydrogen peroxide ($H_2O_2$). Thus, chemical oxide films 168 of about 10 Å in thickness are formed on the front and rear surfaces of the substrate 16 upon completion of the above operation (see FIG. 6B).

While the substrate 16 is being rotated, the control valve 34a is closed to stop the supply of the RCA cleaning solution from the second nozzle 30, and the control valve 36a is opened to supply the deionized water as rinsing water from the second nozzle 30 toward the center of the substrate 16, thereby washing away the RCA cleaning solution remaining on the surfaces of the substrate 16. The deionized water supplied to the inner surface of the cover 22 is drained to the outside through the drain pipe 44 together with the residual solution.

Subsequently, while the substrate 16 is being rotated, the DHF cleaning solution is supplied from the first nozzle 28 toward the center of the front surface of the substrate 16 and, concurrently, the deionized water is supplied from the third nozzles 54 to the rear surface of the substrate 16, thereby removing the chemical oxide film 168 formed on the semiconductor region of the front surface while keeping intact the chemical film 168 formed on the rear surface (see FIG. 6C).

Further, while the substrate 16 is being rotated, the control valve 32a is closed to stop the supply of the DHF cleaning solution from the first nozzle 28, and the control valve 42a is opened to supply the deionized water as rinsing water toward the center of the substrate 16 through the first nozzle 28, thereby washing away the DHF cleaning solution remaining on the surfaces of the substrate 16. The deionized water supplied to the inner surface of the cover 22 is drained to the outside through the drain pipe 44 together with the residual solution.

The $N_2$ gas as the drying gas is supplied from the drying gas supply unit 48 into the cleaning chamber 14 through the drying gas supply pipe 46 to keep the cleaning chamber 14 in a $N_2$ atmosphere. The substrate 16 is dried in the $N_2$ atmosphere. Then, the rotation of the support unit 18 caused by the rotation mechanism 20 is stopped. The $N_2$ gas existing in the cleaning chamber 14 is exhausted through the exhaust pipe 50.

Finally, the substrate 16 is taken out from the cleaning chamber 14 and then conveyed to the afore-mentioned hot-wall type vertical low-pressure CVD apparatus in which the substrate 16 is subjected to such processing as selective growth of an epitaxial film thereon.

Other Embodiments

In some other embodiment, the present disclosure may be modified in many different forms without departing from the scope thereof. While the substrate processing apparatus described in the foregoing embodiments is a hot-wall type vertical low-pressure CVD apparatus, namely a batch type vertical low-pressure CVD apparatus capable of processing a plurality of substrates at one time, the present disclosure is applicable to a unit-wafer-type substrate processing apparatus.

Figure 8:
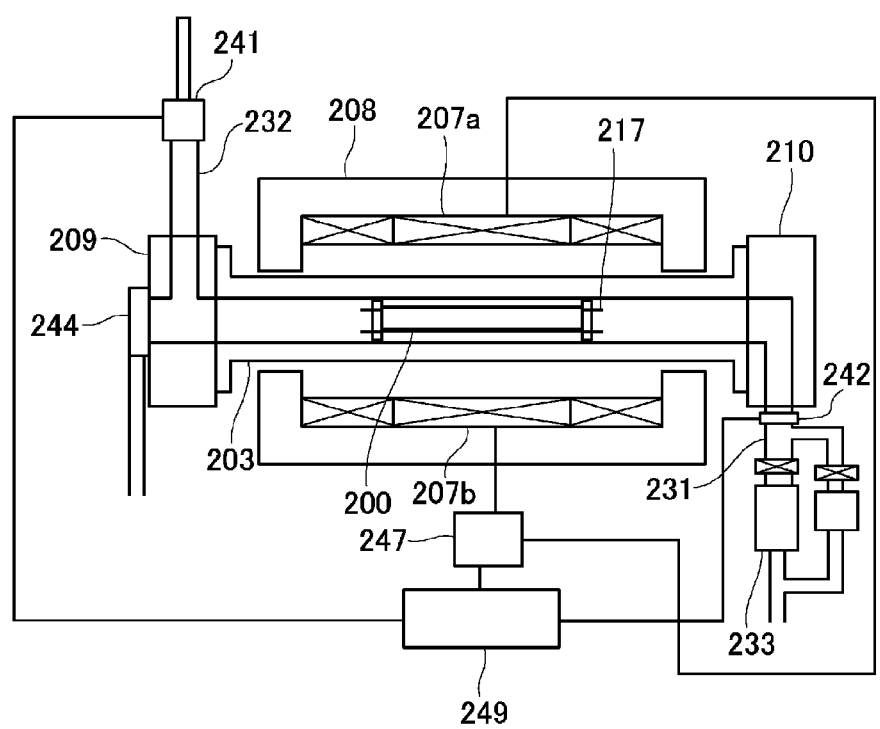
FIG. 8 is a schematic overall view showing a batch-type low-pressure CVD apparatus according to a third embodiment of the present disclosure.

FIG. 8 is a schematic explanation view showing a reaction furnace of a unit-wafer-type (two-wafer-type) substrate processing apparatus.

As shown in FIG. 8, a reaction tube 203 (used as a reaction furnace) made of quartz, silicon carbide or alumina includes a horizontally-extending flat space, i.e., a reaction chamber, for accommodating semiconductor wafers 200 (used as substrates) therein. A wafer support table 217 (used as a substrate holder) configured to support the semiconductor wafers 200 is provided within the reaction tube 203. A gas introduction flange 209 (used as a manifold) is air-tightly attached to the reaction tube 203. A conveying chamber (not shown) is connected to the gas introduction flange 209 through a gate valve 244 (used as a partitioning valve). A gas introduction line 232 (used as a gas supply pipe) is connected to the gas introduction flange 209. An exhaust line 231 (used as an exhaust pipe) is connected to a back flange 210. A pressure control unit 242 configured to control the internal pressure of the reaction tube 203 at a specified pressure is provided in the exhaust line 231. A turbo-molecular pump 233 is connected to the exhaust line 231. The inside of the reaction tube 203 is kept at a high vacuum pressure by the turbo-molecular pump 233. A flow rate control unit 241 configured to control the flow rate of a gas introduced into the reaction tube 203 is provided in the gas introduction line 232.

Since the reaction furnace is of a hot-wall type, an upper heater 207a and a lower heater 207b, both of which compose a heating unit, are provided above and below the reaction tube 203. The upper heater 207a and the lower heater 207b are configured to heat the inside of the reaction tube 203 either uniformly or with a temperature gradient. A temperature control unit 247 configured to control the temperatures of the upper heater 207a and the lower heater 207b is connected to upper heater 207a and the lower heater 207b. A heat insulation material 208 (used as a heat insulation member) is provided to cover the upper heater 207a, the lower heater 207b and the reaction tube 203. The internal temperature of the reaction tube 203, the flow rate of a gas supplied into the reaction tube 203 and the internal pressure of the reaction tube 203 are controlled at specified temperature, flow rate and pressure, respectively, by the temperature control unit 247, the flow rate control unit 241 and a pressure control unit 242, all of which are controlled by a controller 249.

The method of forming a silicon (Si)-containing film through the use of the unit-wafer-type hot-wall reaction furnace is essentially the same as the method of forming silicon (Si)-containing films with the reaction furnace of the hot-wall type vertical low-pressure CVD apparatus. Therefore, no description will be made in that regard.

Hereinafter, some aspects of the present disclosure will be additionally stated.

A first aspect of the present disclosure provides a method of manufacturing a semiconductor device, including: a first step of conveying a first substrate provided with an opposing surface having insulator regions and a semiconductor region exposed between the insulator regions and a second substrate provided with an insulator surface exposed toward the opposing surface of the first substrate, into a process chamber in a state that the second substrate is arranged in a face-to-face relationship with the opposing surface of the first substrate; and a second step of selectively forming a silicon-containing film with a flat surface at least on the semiconductor region of the opposing surface of the first substrate by heating an inside of the process chamber and supplying at least a silicon-containing gas and a chlorine-containing gas into the process chamber.

The second substrate may be configured such that a semiconductor region is exposed between insulator regions on the opposite surface of the second substrate from the opposing surface of the first substrate, and the second step may include selectively forming a silicon-containing film with a flat surface on the semiconductor region of the opposite surface of the second substrate.

The silicon-containing gas may be at least one type of gas selected from the group consisting of a silane gas, a disilane gas and a dichlorosilane gas, and the chlorine-containing gas may be at least one type of gas selected from the group consisting of a chlorine gas and a hydrogen chloride gas.

The insulator regions of the first substrate and the insulator surface of the second substrate may be made of silicon oxide or silicon nitride, and the semiconductor region of the first substrate may be made of silicon.

The insulator regions may be substantially flush with the semiconductor region.

The second step may include causing a material formed by decomposition of the silicon-containing gas and the chlorine-containing gas in a gaseous layer within the process chamber to be adsorbed to at least a rear surface of the second substrate and the semiconductor region of the first substrate.

A second aspect of the present disclosure provides a method of manufacturing a semiconductor device, including: providing a plurality of substrates each provided with a front surface and a rear surface, the front surface having insulator regions and a semiconductor region arranged between the insulator regions, at least the semiconductor region of the front surface being covered with an oxide film, the rear surface being covered with an oxide film; removing the oxide film formed on the semiconductor region of the front surface while keeping intact the oxide film formed on the rear surface; conveying the substrates, in which the oxide film formed on the semiconductor region is removed with the oxide film formed on the rear surface remaining intact, into a process chamber in a state that the substrates are stacked one above another at a predetermined interval; and selectively forming a silicon-containing film on the semiconductor region of each of the substrates by heating the process chamber and supplying at least a silicon-containing gas and a chlorine-containing gas into the process chamber.

The selectively forming the silicon-containing film may include selectively forming a silicon-containing film with a flat surface on the semiconductor region of each of the substrates.

The silicon-containing gas may be at least one type of gas selected from the group consisting of a silane gas, a disilane gas and a dichlorosilane gas, and the chlorine-containing gas may be at least one type of gas selected from the group consisting of a chlorine gas and a hydrogen chloride gas.

The insulator regions may be made of silicon oxide or silicon nitride, and the semiconductor region may be made of silicon.

The insulator regions may be substantially flush with the semiconductor region.

The removing the oxide film may include supplying water to the rear surface of each of the substrates while supplying a hydrofluoric-acid-containing material to the front surface of each of the substrates, to remove the oxide film formed on the semiconductor region of the front surface while keeping intact the oxide film formed on the rear surface.

A third aspect of the present disclosure provides a substrate processing apparatus, including: a process chamber configured to accommodate and process a first substrate provided with an opposing surface having insulator regions and a semiconductor region exposed between the insulator regions and a second substrate provided with an insulator surface exposed toward the opposing surface of the first substrate; a first gas supply system configured to supply a silicon-containing gas into the process chamber; a second gas supply system configured to supply a chlorine-containing gas into the process chamber; a heater configured to heat the first substrate and the second substrate; and a controller configured to control the heater, the first gas supply system and the second gas supply system such that the silicon-containing gas and the chlorine-containing gas are supplied between the first substrate and the second substrate arranged in a face-to-face relationship with the opposing surface of the first substrate, to selectively form a silicon-containing film with a flat surface at least on the semiconductor region of the first substrate.

A fourth aspect of the present disclosure provides a method including: conveying a substrate holder configured to hold a plurality of substrates staked one above another at a predetermined interval, into a process chamber, each of the substrates provided with a front surface and a rear surface, the front surface having insulator regions and a semiconductor region exposed between the insulator regions, the rear surface exposing an insulator surface; and forming a silicon-containing film on the semiconductor region of each of the substrates by heating the process chamber and supplying at least a silicon-containing gas and a chlorine-containing gas into the process chamber.

A fifth aspect of the present disclosure provides a method including: providing a first substrate having a semiconductor region exposed between insulator regions and a second substrate having an insulator surface opposing the first substrate; and supplying at least a silicon-containing gas and a chlorine-containing gas into at least the first substrate and the second substrate, thereby selectively forming a silicon-containing film with a flat surface on at least the semiconductor region of the first substrate.

According to the present disclosure, it is possible to selectively form a silicon-containing film with a flat surface on a semiconductor region of a substrate in a reliable manner.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   conveying a first substrate provided with an opposing surface including insulator regions and a semiconductor region exposed between the insulator regions and a second substrate provided with an insulator surface exposed toward the opposing surface of the first substrate, into a process chamber in a state that the second substrate is arranged to face the opposing surface of the first substrate;
   selectively forming a silicon-containing film with a flat surface at least on the semiconductor region of the opposing surface of the first substrate by heating an inside of the process chamber and supplying at least a silicon-containing gas and a chlorine-containing gas into the process chamber; and
   wherein selectively forming a silicon-containing film includes causing a material formed by decomposition of the silicon-containing gas and the chlorine-containing gas in a gaseous layer within the process chamber to be adsorbed to at least a rear surface of the second substrate and the semiconductor region of the first substrate.

2. The method of claim 1, wherein the second substrate is configured such that a semiconductor region is exposed between insulator regions on the opposite surface of the second substrate from the opposing surface of the first substrate, and wherein selectively forming a silicon film includes selectively forming a silicon-containing film with a flat surface on the semiconductor region of the opposite surface of the second substrate.

3. The method of claim 1, wherein the silicon-containing gas is at least one type of gas selected from the group consisting of a silane gas, a disilane gas and a dichlorosilane gas, and the chlorine-containing gas is at least one type of gas selected from the group consisting of a chlorine gas and a hydrogen chloride gas.

4. The method of claim 1, wherein the insulator regions of the first substrate and the insulator surface of the second substrate are made of silicon oxide or silicon nitride and the semiconductor region of the first substrate is made of silicon.

5. The method of claim 1, wherein the insulator regions are substantially flush with the semiconductor region.

6. A method of manufacturing a semiconductor device, comprising:
   providing a plurality of substrates each provided with a front surface and a rear surface, the front surface including insulator regions and a semiconductor region arranged between the insulator regions, at least the semiconductor region of the front surface being covered with an oxide film, the rear surface being covered with an oxide film;
   removing the oxide film formed on the semiconductor region of the front surface while keeping intact the oxide film formed on the rear surface;
   conveying the substrates, in which the oxide film formed on the semiconductor region is removed with the oxide film formed on the rear surface remaining intact, into a process chamber in a state that the substrates are stacked one above another at a predetermined interval; and
   selectively forming a silicon-containing film on the semiconductor region of each of the substrates by heating the process chamber and supplying at least a silicon-containing gas and a chlorine-containing gas into the process chamber.

7. The method of claim 6, wherein the selectively forming a silicon-containing film includes selectively forming a silicon-containing film with a flat surface on the semiconductor region of each of the substrates.

8. The method of claim 6, wherein the silicon-containing gas is at least one type of gas selected from the group consisting of a silane gas, a disilane gas and a dichlorosilane gas, and the chlorine-containing gas is at least one type of gas selected from the group consisting of a chlorine gas and a hydrogen chloride gas.

9. The method of claim 6, wherein the insulator regions are made of silicon oxide or silicon nitride and the semiconductor region is made of silicon.

10. The method of claim 6, wherein the insulator regions are substantially flush with the semiconductor region.

11. The method of claim 6, wherein the removing the oxide film includes supplying water to the rear surface of each of the substrates while supplying a hydrofluoric-acid-containing material to the front surface of each of the substrates, to remove the oxide film formed on the semiconductor region of the front surface while keeping intact the oxide film formed on the rear surface.

* * * * *